United States Patent
Yang et al.

(10) Patent No.: US 6,825,080 B1
(45) Date of Patent: Nov. 30, 2004

(54) METHOD FOR FORMING A MIM CAPACITOR

(75) Inventors: Bin Yang, Singapore (SG); Sanford Chu, Singapore (SG); Wensheg Qian, Singapore (SG); Tan Li Jia, Singapore (SG); Chang Chuan Hu, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/677,830

(22) Filed: Oct. 2, 2003

(51) Int. Cl.⁷ .......................................... H01L 21/8242
(52) U.S. Cl. ...................... 438/250; 438/253; 438/258; 438/239; 438/240; 438/243; 438/386; 438/393; 438/622; 257/301; 257/532; 257/528
(58) Field of Search ................................ 438/250, 253, 438/258, 239, 240, 243, 386, 393, 622; 257/301, 532, 528

(56) References Cited

U.S. PATENT DOCUMENTS

| | | | |
|---|---|---|---|
| 6,025,226 A | * 2/2000 | Gambino et al. | 438/244 |
| 6,387,750 B1 | * 5/2002 | Lai et al. | 438/250 |
| 6,426,250 B1 | * 7/2002 | Lee et al. | 438/239 |
| 6,451,650 B1 | 9/2002 | Lou | |
| 6,468,873 B1 | 10/2002 | Liu et al. | |
| 6,559,004 B1 | 5/2003 | Yang et al. | |
| 6,646,323 B2 | * 11/2003 | Dirnecker et al. | 257/532 |
| 6,670,237 B1 | * 12/2003 | Loh et al. | 438/253 |
| 2002/0019123 A1 | 2/2002 | Ma et al. | |
| 2003/0148581 A1 | * 8/2003 | Kim et al. | 438/253 |
| 2003/0183862 A1 | * 10/2003 | Jin et al. | 257/301 |
| 2003/0224571 A1 | * 12/2003 | Iijima et al. | 438/253 |

* cited by examiner

Primary Examiner—Caridad Everhart
Assistant Examiner—Victor V Yevsikov

(57) ABSTRACT

A method of manufacturing a MIM capacitor which is characterized as follows. We provide a semiconductor structure having a first region and a capacitor region. Next we form a first conductive layer over the semiconductor structure. The first conductive layer is patterned to form a plurality of trenches in the capacitor region. We form a capacitor dielectric layer over the first conductive layer. We form a top plate over the capacitor dielectric layer in the capacitor region. The first conductive layer in the first region is patterned to form conductive patterns and a bottom plate. An interlevel dielectric layer is formed over the first conductive layer and top plate.

17 Claims, 5 Drawing Sheets

METHOD FOR FORMING A MIM CAPACITOR

BACKGROUND OF INVENTION

1) Field of the Invention

This invention relates generally to fabrication of semiconductor devices and more particularly to the fabrication of a MIM capacitor and conductive lines.

2) Description of the Prior Art

There are many types of capacitor structures for semiconductor integrated circuits, such as metal-oxide-semiconductor (MOS) capacitors, PN junction capacitors, and polysilicon-insulator-polysilicon (PIP) capacitors. Each of these capacitor structures includes at least one monocrystalline silicon layer or polycrystalline silicon layer which is used as a capacitor electrode. The use of silicon for the capacitor electrode, however, may result in a higher electrode resistance than is desired.

It is thus desirable to reduce the resistance of capacitor electrodes to decrease frequency dependence of the capacitor. Accordingly, metal-insulator-metal (MIM) thin film capacitors have been developed to provide low electrode resistances. Moreover, metal-insulator-metal capacitors can be used in integrated circuits requiring high speed performance. In addition, metal-insulator-metal thin film capacitors have been applied to advanced analog semiconductor devices because these capacitors have capacitance fluctuation rates dependent on voltage and temperature which are sufficiently low to provide desirable electrical characteristics.

In addition, there have been efforts to reduce thicknesses of dielectric layers for integrated circuit capacitors to thereby increase the performance of capacitors including these thinner dielectric layers. In particular, the capacitance of a capacitor can be increased by reducing the thickness of the dielectric layer between the two electrodes of the capacitor. There have also been efforts to increase capacitances by using dielectric layers having relatively high dielectric constants, and by increasing the surface areas of the capacitor electrodes. Furthermore, multi-wiring or multilevel interconnect processes have been applied to semiconductor manufacturing methods to facilitate the development of high-density integration and microelectronic technology.

Thus it is very necessary to provide a novel process of forming MIM capacitors which can provide a new structure of the MIM capacitors having large capacitance as well as high integration of the integrated circuit.

The inventors have found that with the standard CMOS technology being applied in mixed signal and analog integrated circuits arena, more and more passive elements are required for various applications. Due to its good performance and simplicity of integration with CMOS technology, metal-insulator-metal {MIM} capacitor is widely used for analog and RF purposes. However, due to its nature of backend processing, the dielectric thickness used in MIM is much higher than poly-insulator-poly (PIP) and polyinsulator-substrate (PIS) capacitors. This leads to lower specific capacitance (capacitance per unit area) for MIM capacitor, When used for RF application, higher specific capacitance, which means smaller area for a given capacitance value, becomes more important when low coupling noise between the MIM and substrate is considered semiconductor.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 6,387,750B1(Lai et al.) shows a process for a MIM capacitor.

U.S. Pat. No. 6,559,004b1(Yang et al.) shows a process for forming a MIM capacitor.

U.S. Pat. No. 6,468,873b1(Lui et al. al.) shows a CU MIM process.

US 2002/0019123A1—Ma et al. discloses a Cu MIM process.

U.S. Pat. No. 6,426,250 (Lee,et al.) shows a High density stacked MIM capacitor structure.

U.S. Pat. No. 6,451,650 (Lou) discloses a Low thermal budget method for forming MIM capacitors.

SUMMARY OF THE INVENTION

An embodiment of the present invention provides a method of manufacturing a MIM capacitor which is characterized as follows.

We provide a semiconductor structure having a first region and a capacitor region. Next we form a conductive layer over the semiconductor structure. The first conductive layer is patterned to form a plurality of trenches in the capacitor region. We form a capacitor dielectric layer over the first conductive layer. Next, we form a top plate over the capacitor dielectric layer in the capacitor region to form a capacitor. The first conductive layer in the first region is patterned to form conductive patterns and a bottom plate. An interlevel dielectric layer is formed over the first conductive layer.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

It is to be understood and appreciated that the process steps and structures described below do not cover a complete process flow. The present invention can be practiced in conjunction with various integrated circuit fabrication techniques that are used in the art, and only so much of the commonly practiced process steps are included herein as are necessary to provide an understanding of the present invention.

The present invention will be described in detail with reference to the accompanying drawings. It should be noted that the drawings are in greatly simplified form and they are not drawn to scale. Moreover, dimensions have been exaggerated in order to provide a clear illustration and understanding of the present invention.

An embodiment of a method of fabrication of a MIM capacitor and conductive line is described as follows.

A. Semiconductor Structure and First Conductive Layer

Figure 1:
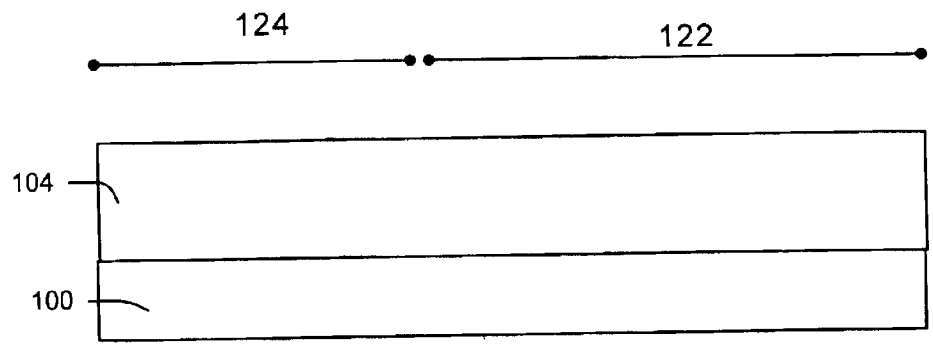
FIGS. 1, 2, 3A, 4, 5, 6, 7, 8, 9 and 10 are cross sectional views for illustrating a method for forming a capacitor and conductive lines according to an embodiment of the present invention.

As shown in FIG. 1, we provide a semiconductor structure 100 having a first region 124 and a capacitor region 122. The semiconductor structure can comprise, but is not limited to a substrate having an insulating layer or layers and a conductive layer or layers thereover. The substrate can be a substrate used in semiconductor manufacturing, such as silicon wafer, GaAs substrate or SIO substrate. The top surface of the semiconductor structure 100 is preferably a dielectric layer (e.g, IMD layer) and exposed portions of a underlying conductive layer (interconnect layer n−2 or (n−2) metal layer).

A MIM capacitor will be subsequently formed in the capacitor region 122. Conductive patterns, such as wiring interconnects (e.g., metal lines, wiring layers etc.), will be formed from the first conductive layer 104 in the first region 124.

As shown in FIG. 1, we form a conductive layer 104 over the semiconductor structure.

The first conductive layer 104 is preferably comprise of alloys of Al, Cu, Ti, Ta, etc. and preferably has a thickness in the range of between 3000 and 10000 Å (angstrom).

The first conductive layer 104 will be formed into at least a bottom plate for a capacitor and preferably a n−1 level conductive interconnect layer (e.g., n−1 metal layer or wiring layer).

B. Pattern the First Conductive Layer 104 to Form a Plurality of Trenches

Figure 2:
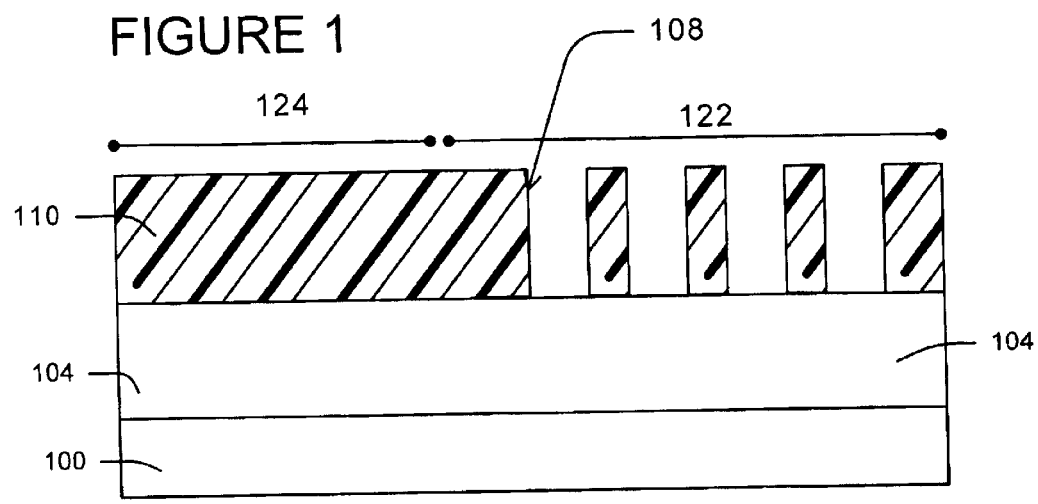
Figure 3A:
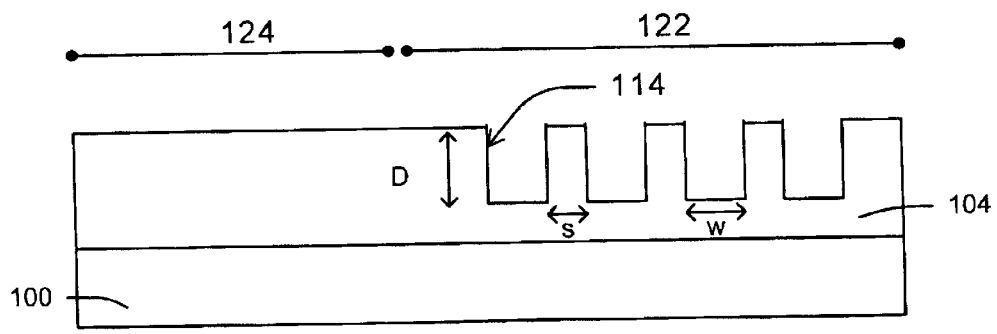
Figure 3B:
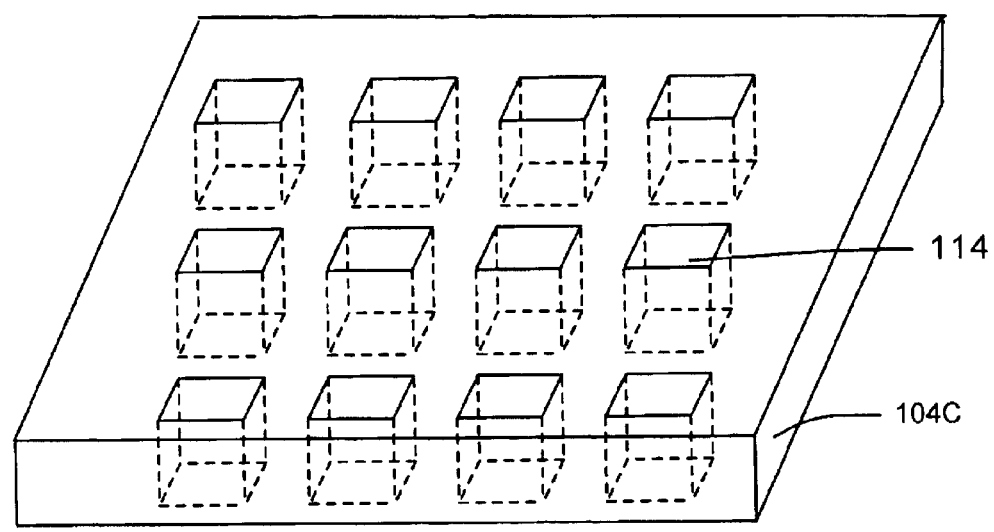
FIG. 3B is a three dimensional view of the bottom plate with trenches according to an embodiment of the invention.

Referring to FIGS. 2, 3A and 3B, we pattern the first conductive layer 104 to form a plurality of trenches 114 in the capacitor region 122. The trenches increase the capacitance area for the subsequently formed MIM capacitor. Preferably trenches are only formed in the capacitor region 122.

To create the plurality of trenches 114, preferably first, we form a trench resist layer 110 over the first conductive layer 104 as shown in FIG. 2. The trench resist layer has openings 108 that define areas where trenches will be formed in the capacitor area.

As shown in FIG. 3A, trenches 114 are etched using the trench resist layer 110 as an etch mask. The trenches are preferably only etched in the capacitor region 122. Preferably the trench resist layer has no opening in the first region. The resist layer is removed.

The trenches preferably have a Depth (D) between 2400 and 8000 Å of the first conductive layer 104. The trenches extend down into the conductive layer between 24% and 80% of the thickness of the conductive layer 104. The trenches have a width W between 2000 Å and 10000 Å, depending on the technology used. The larger dimension in D and smaller dimension in W, give a bigger gain in capacitance value.

Preferably as shown FIG. 3B, the plurality of trenches is formed in a pattern of rows and columns (e.g., checkerboard) in the capacitor region. That is the trenches are lined up in a grid pattern as shown in FIG. 3B. The plurality of trench forms a "sea of trenches". The smaller the spacing between the trenches in FIG. 3B, the larger gain the capacitance. Its limit depends on how advance the technology used. For example, current industry leading-edge 0.13 um technology node presents a limit of about 0.2 um space. For less advanced technology, the space limit can't be as small as 0.2 um. It might be looser, say about 0.3 um for 0.18 um technology node. The larger dimension in Depth D and smaller the spacing and width of sea of trenches, the higher density of the trenches. Therefore, the bigger gain in capacitance value.

C. Form a Capacitor Dielectric Layer 118

Figure 4:
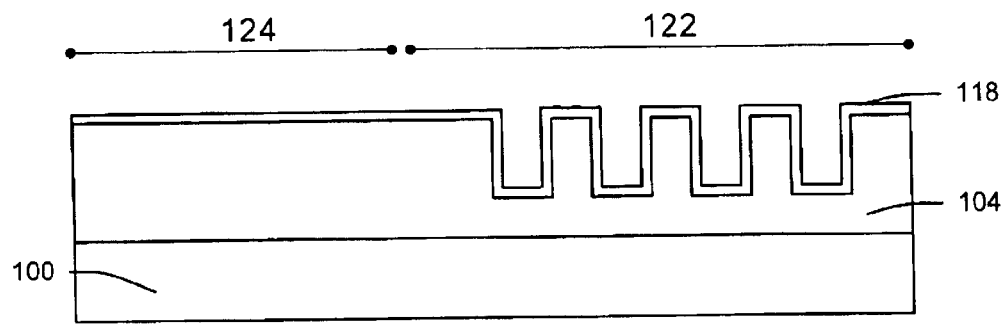

As shown in FIG. 4, we form a capacitor dielectric layer 118 over the first conductive layer 104. The capacitor dielectric layer 118 preferably has a thickness between 100 and 1000 Å and is preferably comprised of silicon oxide, silicon nitride, silicon oxide-nitride, and tantalum oxide. The dielectric layer can be formed by plasma enhanced chemical vapor deposition. The thickness of the dielectric layer depends on how electrical dielectric strength required. A higher dielectric strength requires a thicker dielectric layer.

D. Form a Top Plate 120

Figure 5:
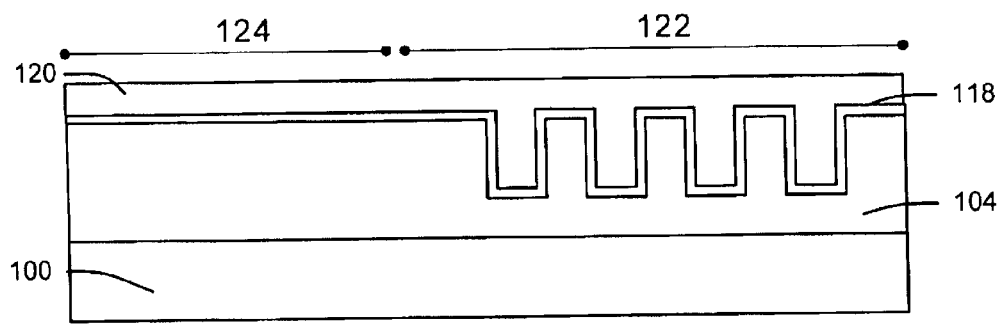
Figure 6:
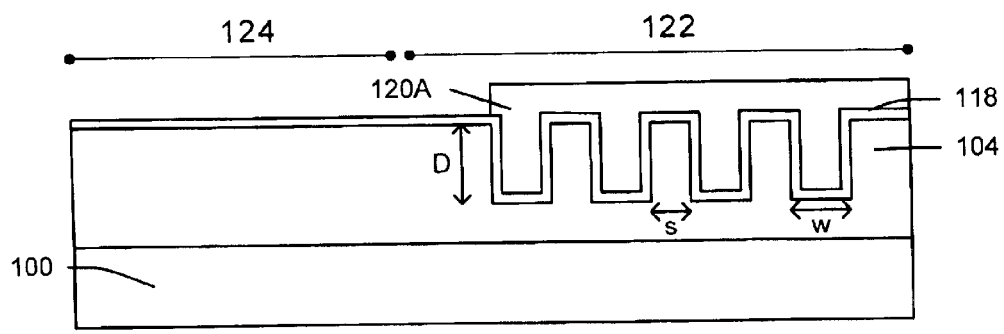

Referring to FIGS. 5 and 6, we form a top plate 120A over the capacitor dielectric layer 118 in the capacitor region 122.

The top plate 120 is preferably formed by forming a top plate layer 120 over the capacitor dielectric layer 120. Then we mask and pattern the top plate layer 120 preferably using a resist and etch process.

The top plate 120A preferably has a thickness between 700 and 1500 Å and is preferably comprise of TiN, Cu, or Al alloy.

E. Pattern the First Conductive Layer in the First Region to Form Conductive Patterns 104L

Figure 7:
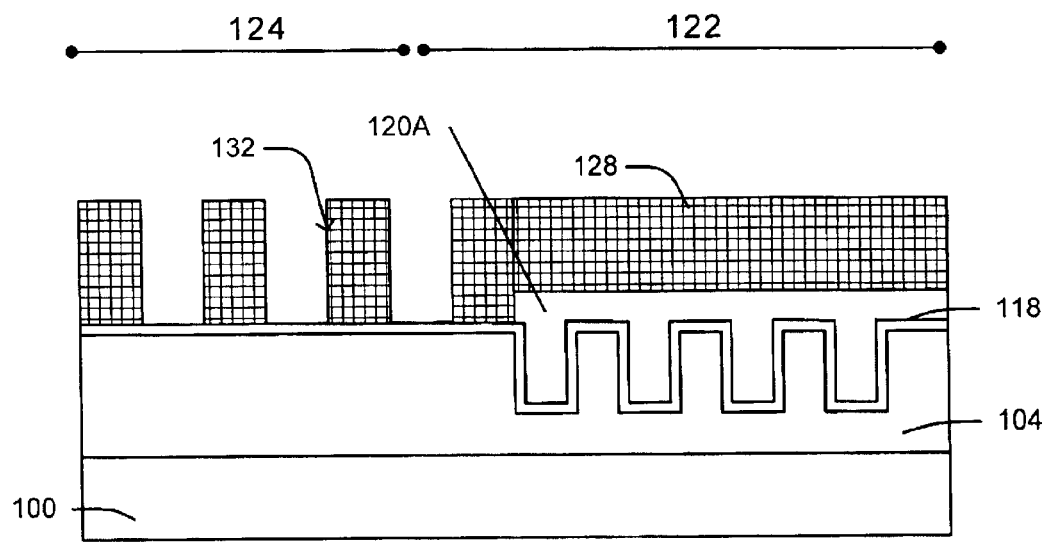
Figure 8:
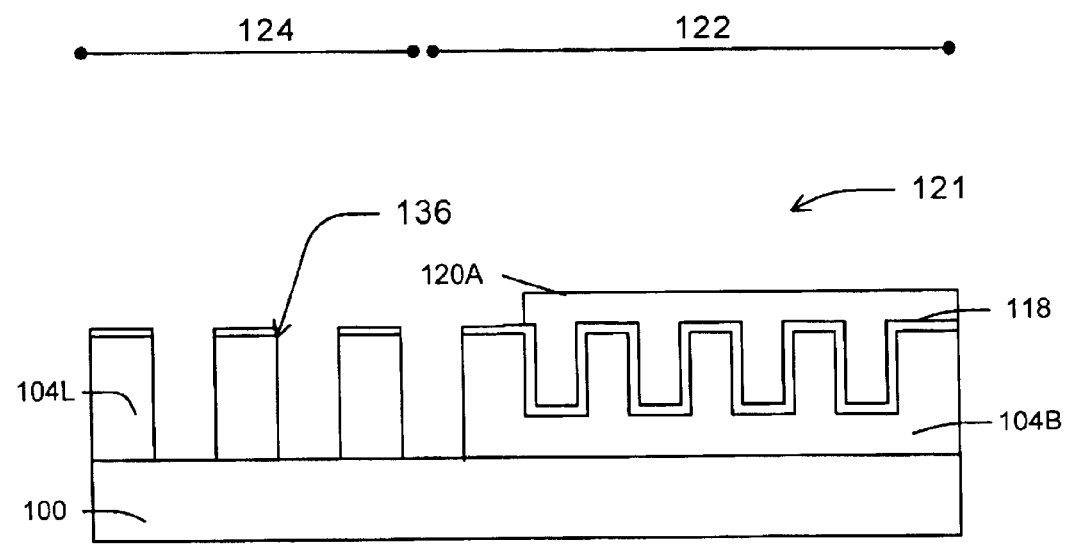

Referring to FIGS. 7 and 8, next we patterned the first conductive layer in the first region 124 to form conductive patterns 104L (e.g., metal lines or interconnects) and a bottom plate 104B. First, as shown in FIG. 7, we form a bottom metal resist mask 128 over the first conductive layer. The bottom metal resist mask 128 has openings 136 that define the interconnect lines and patterns (e.g., N−1 metal-interconnect layer). As shown in FIG. 8, we etch the first conductive layer using the bottom metal resist mask 128 as an etch mask. This forms to form conductive patterns 104L (e.g., metal lines or interconnects) and a bottom plate 104B. The mask is then removed.

The embodiment's single step of patterning the first conductive layer to form line patterns 104L (after the etch trenches in the first conductive layer) is important because the embodiment patterning step is more accuracy and manufacturable.

A MIM capacitor 121 is formed in the capacitor region 122. The MIM capacitor is comprised of: the top plate 120A, capacitor dielectric 118 and the bottom plate 104B.

F. Form an Interlevel Dielectric Layer 144

Figure 9:
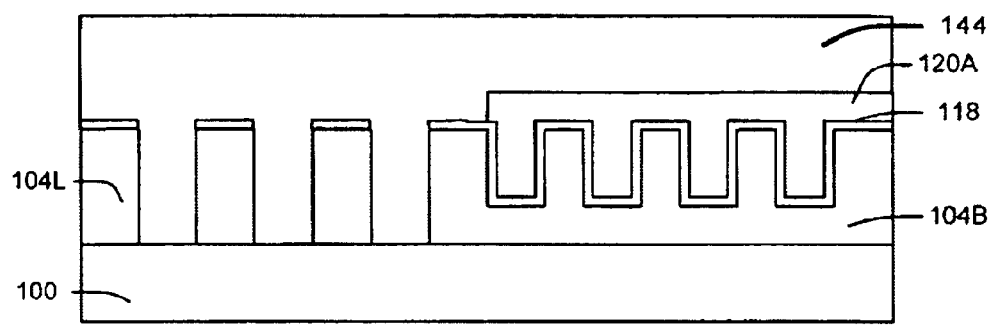

As shown in FIG. 9, we form an interlevel dielectric layer 144 over the first conductive layer. The interlevel dielectric layer 144 is preferably formed of high density plasma enhanced chemical vapor silicon oxide deposition combined with plasma enhanced TEOS (tetraethyl orthosilicate). The interlevel dielectric layer is preferably planarized using chemical-mechanical polishing (CMP) process.

Preferably, the interlevel dielectric layer 144 is used to insulate between the adjacent metal layers 104L (n−1 level) and 130 ((Fig. 10,) n-level metal).

G. Form Interconnects 124A 124B 124C 130A 130B 130C to Contact the Top Plate 120, the Bottom Plate 104 and the Conductive Patterns 104L

Next we form interconnects 124A 124B 124C 130A 130B 130C to contact the top plate 120, the bottom plate 104 and the conductive patterns 104L. The capacitor top plate interconnects 124A 130A contact the capacitor top plate 120. The capacitor bottom plate interconnect 104B contact the capacitor bottom plate 104B. The line interconnects 130C contact the conductive patterns 104L.

Figure 10:
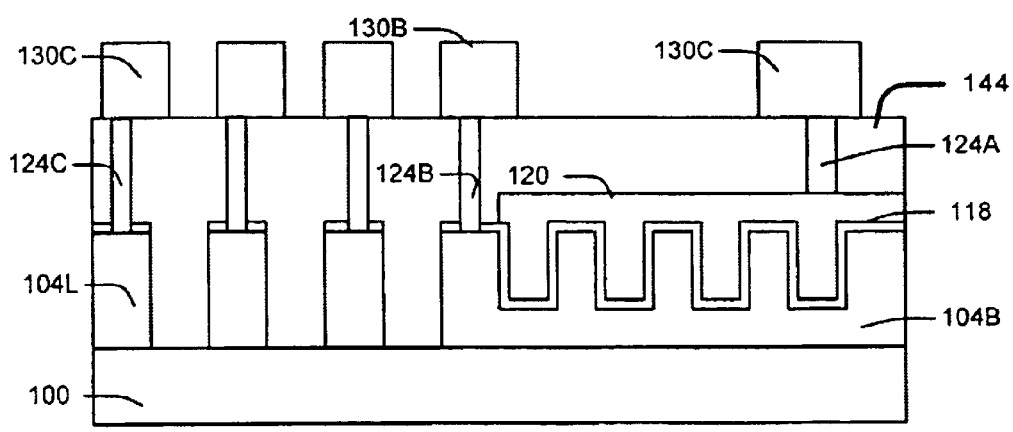

Preferably as shown in FIG. 10, we form via contacts 124A 124B 124C in the interlevel dielectric layer 144 to contact the top plate 120, the bottom plate 104 and the conductive patterns 104L.

Next we form a second conductive layer 120A 130B 130C over the interlevel dielectric layer 144 and the via contacts 124A 124B 124C. The second conductive layer is preferably the n level conductive wiring layer or n level interconnect.

It is possible to use other interconnect process to contact the top plate 120, the bottom plate 104 and the conductive patterns 104L.

H. Benefits

Embodiments of the invention provide a process of forming a three dimensional MIM capacitor with increased capacitance. The embodiment has a lower coupling noise between the MIM and the substrate.

The embodiments of the invention provide a three dimensional MIM capacitor which can effectively upgrade the integration of integrated circuits.

Importantly, the embodiments pattern the wiring layer in separate subsequent steps than the etch steps to form trenches in the bottom plate. Specifically, the invention does not etch the (bottom plate) trenches in the first region 124 when the bottom plate trenches 114 in the capacitor region 122 are etched. See FIG. 3A. This is an significant advantage because the embodiment's single etch process to pattern the lines 104L (FIG. 8) is more precise, simpler and more manufacturability than a double etch process.

The bottom interconnects 104L in non-MIM area 124 are not affected by MIM trench 114 patterning and etch process (See FIGS. 2 and 3A).

In the above description numerous specific details are set forth such as thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention.

Although this invention has been described relative to specific insulating materials, conductive materials and apparatuses for depositing and etching these materials, it is not limited to the specific materials or apparatuses but only to their specific characteristics, such as conformal and nonconformal, and capabilities, such as depositing and etching, and other materials and apparatus can be substituted as is well understood by those skilled in the microelectronics arts after appreciating the present invention While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabrication of a capacitor comprising the steps of:
   a) providing a semiconductor structure having a first region and a capacitor region;
   b) forming a first conductive layer over said semiconductor structure;
   c) patterning said first conductive layer to form a plurality of trenches only in said capacitor region and not forming trenches in said first region;
   d) forming a capacitor dielectric layer over said first conductive layer;
   e) forming a top plate over said capacitor dielectric layer in the capacitor region;
   f) patterning said first conductive layer in said first region to form first conductive patterns and a bottom plate;
   g) forming an interlevel dielectric layer over said first conductive layer.

2. The method of claim 1 which further includes forming interconnects to electrically contact said top plate, said bottom plate and said first conductive patterns.

3. The method of claim 1 which further includes:
   said first conductive pattern comprise a n−1 level wiring layer;
   forming via contacts in said interlevel dielectric layer to contact said top plate, said bottom plate and said first conductive patterns;
   forming a second conductive line contacting said via contacts.

4. The method of claim 1 which further includes:
   forming via contacts in said interlevel dielectric layer to contact said top plate, said bottom plate and said first conductive patterns;
   forming second conductive layer contacting said via contacts; said second conductive layer is a n level metal layer; said first conductive patterns comprise a n−1 level metal layer.

5. The method of claim 1 wherein said first conductive layer is comprised of Al, Ti, Ta, Cu and alloys of Al, Ti, Ta, or Cu; and has a thickness in the range of between 3000 and 10,000 Å.

6. The method of claim 1 wherein said plurality of trenches formed in a pattern of rows and columns.

7. The method of claim 1 wherein said trenches extend down into the conductive layer between 24% and 84% of the thickness of said first conductive layer.

8. The method of claim 1 wherein step (c) further comprises:
   forming a trench resist layer over said first conductive layer; said trench resist layer only has openings that define areas where trenches will be formed in first conductive layer in said capacitor area;
   patterning said first conductive layer to form a plurality of trenches only in said capacitor region;
   removing said trench resist layer.

9. The method of claim 1 wherein said capacitor dielectric layer has a thickness between 100 and 1000 Å and is comprised of a material selected from the group consisting of silicon oxide, silicon nitride, silicon oxide-nitride, and tantalum oxide.

10. The method of claim 1 wherein said top plate is formed by forming a top plate layer over said capacitor dielectric layer; and masking and patterning said top plate layer.

11. The method of claim 1 wherein step (f) further comprises: forming a bottom metal resist mask over the first conductive layer, the bottom metal resist mask has openings that define the interconnect lines;

patterning said first conductive layer in said first region to form first conductive patterns and a bottom plate;

removing said bottom metal resist mask.

12. The method of claim 1 wherein said interlevel dielectric layer is comprised of oxide formed using a high density plasma enhanced chemical vapor silicon oxide deposition combined with plasma enhanced tetraethyl orthosilicate; and interlevel dielectric layer is preferably planarized using a chemical-mechanical polish process.

13. A method of fabrication of a capacitor comprising the steps of:
   a) providing a semiconductor structure having a first region and a capacitor region;
   b) forming a first conductive layer over said semiconductor structure;
   c) forming a trench resist layer over said first conductive layer; said trench resist layer has openings that define areas where trenches will be formed in first conductive layer only in said capacitor area; then
   d) patterning said first conductive layer to form a plurality of trenches in only said capacitor region; then
      (1) said trenches extend down into the conductive layer between 24% and 84% of the thickness of said first conductive layer;
   e) removing said trench resist layer; then
   f) forming a capacitor dielectric layer over said first conductive layer; then
   g) forming a top plate over said capacitor dielectric layer in the capacitor region; said top plate is formed by forming a top plate layer over said capacitor dielectric layer; and masking and patterning said top plate layer; then
   h) patterning said first conductive layer in said first region to form first conductive patterns and a bottom plate; said first conductive patterns comprise a n−1 level metal layer;
   i) forming an interlevel dielectric layer over said first conductive layer and said top plate;
   j) forming via contacts in said interlevel dielectric layer to contact said top plate, said bottom plate and said first conductive patterns;
   k) forming second conductive layer contacting said via contacts; said second conductive layer is a n level metal layer.

14. The method of claim 13 wherein said first conductive layer is comprised of Al, Ti, Ta, Cu and alloys of Al, Ti, Ta, or Cu; and has a thickness in the range of between 3000 and 10,000 Å.

15. The method of claim 13 wherein said plurality of trenches formed in a pattern of rows and columns.

16. The method of claim 13 wherein said top plate is formed by forming a top plate layer over said capacitor dielectric layer; and masking and patterning said top plate layer.

17. The method of claim 13 wherein step (h) further comprises: forming a bottom metal resist mask over the first conductive layer; the bottom metal resist mask has openings only in said first region that define the interconnect lines;

patterning said first conductive layer in said first region to form first conductive patterns and a bottom plate;

removing said bottom metal resist mask.

* * * * *